United States Patent
Moore et al.

(10) Patent No.: US 11,500,040 B2
(45) Date of Patent: Nov. 15, 2022

(54) STRAY MAGNETIC FIELD CANCELLATION FOR STEERING TORQUE SENSOR

(71) Applicant: STEERING SOLUTIONS IP HOLDING CORPORATION, Saginaw, MI (US)

(72) Inventors: Jared K. Moore, Saginaw, MI (US); Clane J. Cammin, Freeland, MI (US); Keith A. Kidder, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 276 days.

(21) Appl. No.: 16/906,166

(22) Filed: Jun. 19, 2020

(65) Prior Publication Data

US 2020/0400758 A1 Dec. 24, 2020

Related U.S. Application Data

(60) Provisional application No. 62/864,262, filed on Jun. 20, 2019.

(51) Int. Cl.
*G01R 33/00* (2006.01)
*G01R 33/025* (2006.01)
(Continued)

(52) U.S. Cl.
CPC .......... *G01R 33/025* (2013.01); *B62D 6/10* (2013.01); *B62D 5/0463* (2013.01)

(58) Field of Classification Search
CPC ...... G01R 33/00; G01R 33/025; G01R 33/07; G01B 7/14; G01B 7/30; G01D 5/16
See application file for complete search history.

(56) References Cited

U.S. PATENT DOCUMENTS 6,928,887 B2  8/2005  Nakane et al.
7,028,545 B2  4/2006  Gandel et al.
(Continued)

FOREIGN PATENT DOCUMENTS

CN  105277303 A  1/2016
CN  108450056 A  8/2018
(Continued)

OTHER PUBLICATIONS

Chinese Office Action from the Chinese Patent Office for related Chinese Patent Application No. 202010559807.4 dated Apr. 19, 2022, 10 page(s).

(Continued)

*Primary Examiner* — Neel D Shah
(74) *Attorney, Agent, or Firm* — Dickinson Wright PLLC

(57) ABSTRACT

A method for steering torque sensor stray magnetic field cancellation includes receiving, from at least one magnetic sensor disposed within a torque sensing region, a detected magnetic field corresponding to an angular displacement between an upper steering shaft and a lower steering shaft of an electronic power steering system. The method also includes generating a first torque signal based on the detected magnetic field and receiving, from at least one stray region sensor disposed outside of the torque sensing region, a detected stray magnetic field. The method also includes determining a torque signal error based on the detected stray magnetic field and generating a second torque signal based on the first torque signal and the torque signal error. The method also includes selectively controlling at least a portion of the electronic power steering system using the second torque signal.

20 Claims, 7 Drawing Sheets

(51) Int. Cl.
*G01R 33/07* (2006.01)
*G01B 7/14* (2006.01)
*G01B 7/30* (2006.01)
*G01D 5/16* (2006.01)
*B62D 6/10* (2006.01)
*B62D 5/04* (2006.01)

(56) References Cited

U.S. PATENT DOCUMENTS

| | | | |
|---|---|---|---|
| 8,448,528 | B2 | 5/2013 | McDonald et al. |
| 8,578,794 | B2 | 11/2013 | Lee |
| 8,587,294 | B2 | 11/2013 | Masson et al. |
| 8,776,619 | B2 | 7/2014 | Jammer |
| 8,960,020 | B2 | 2/2015 | Islam et al. |
| 2005/0172727 | A1 | 8/2005 | Pattok et al. |
| 2005/0172732 | A1 | 8/2005 | Feng et al. |
| 2009/0027045 | A1 | 1/2009 | Islam et al. |
| 2012/0312088 | A1 | 12/2012 | Kang |
| 2014/0139207 | A1* | 5/2014 | Nakamura ......... B62D 15/0215 324/207.12 |
| 2017/0089732 | A1 | 3/2017 | Gießibl |
| 2018/0335357 | A1 | 11/2018 | Jo |
| 2019/0047619 | A1* | 2/2019 | Tóth ................... G01L 5/221 |

FOREIGN PATENT DOCUMENTS

| | | |
|---|---|---|
| CN | 108698640 A | 10/2018 |
| DE | 10334204 A1 | 3/2005 |
| DE | 102015122179 A1 | 6/2017 |
| EP | 2455735 A1 | 5/2012 |
| EP | 3181431 A1 | 6/2017 |

OTHER PUBLICATIONS

Official Letter received by the German Patent and Trademark Office for related German Patent Application No. 102020116197.2 dated Aug. 4, 2022, 11 pages.

* cited by examiner

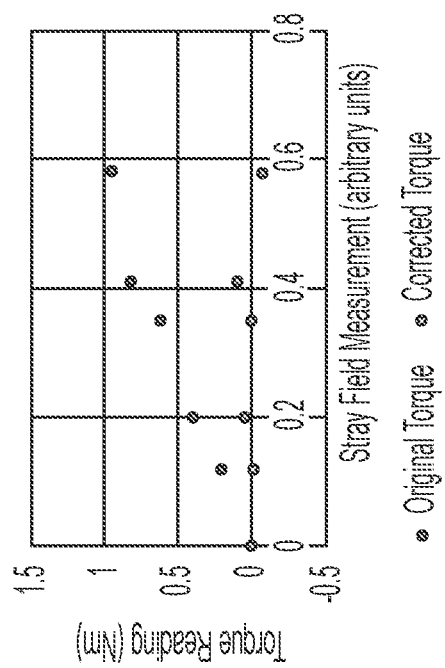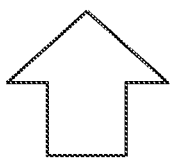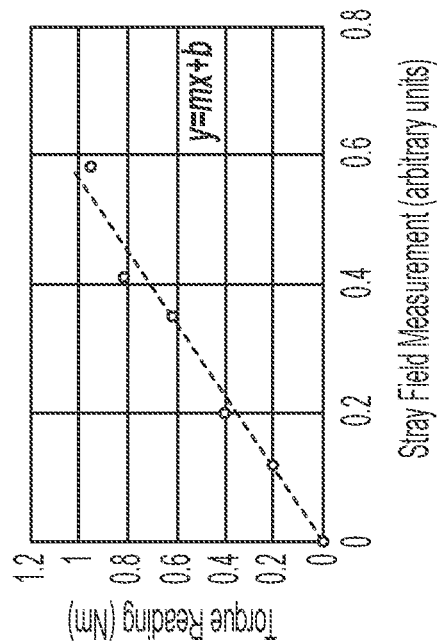
FIG. 4

STRAY MAGNETIC FIELD CANCELLATION FOR STEERING TORQUE SENSOR

CROSS-REFERENCES TO RELATED APPLICATIONS

This patent application claims priority to U.S. Provisional Patent Application Ser. No. 62/864,262, filed Jun. 20, 2019, which is incorporated herein by reference in its entirety.

TECHNICAL FIELD

This disclosure relates to electric power steering systems, and in particular to stray magnetic field cancellation for steering torque sensors of electric power steering systems.

BACKGROUND

Vehicles, such as cars, trucks, sport utility vehicles, crossovers, mini-vans, or other suitable vehicles, typically include power steering features, such as an electronic power steering (EPS) system. The EPS system is typically configured to provide a steering assist to an operator of a corresponding vehicle. For example, the EPS system may be configured to apply an assist torque to an electric motor, which is connected to a steering mechanism. As the operator interacts with a handwheel or steering wheel associated with the steering mechanism, the amount of force or torque applied by the operator on the handwheel or steering wheel is assisted (e.g., reducing amount of force or torque required by the operator to perform a corresponding steering maneuver) by the electric motor.

In such EPS systems, a measurement of an input torque corresponding to an amount of torque applied by an operator on the handwheel is measured by a torque sensor. Typically, the torque sensor detects an angular displacement between an upper and lower shaft in the EPS system. The shafts are assembled in line with a torsion bar internally affixed between the shafts, such that when torque is applied between the shafts there is a twist angle that is linearly proportional to the torque applied by the operator on the handwheel. This twist angle facilitates a flow of magnetic flux between two rotors assembled to either shaft. The upper shaft rotor typically includes permanent magnets that act as a magnetic source, while the lower shaft rotor typically includes a pair of ferromagnetic ring structures that act as a magnetic flux path. The ferromagnetic ring structures transmit magnetic flux through an air gap region and the flux density produced in a given cross-sectional area of the air gap region is linearly proportional to the displacement angle and the torque applied on the shaft. This flux density can be measured using magnetic sensors (such as Hall effect sensors) to create an electric signal proportional to the applied torque.

SUMMARY

This disclosure relates generally to electronic power steering systems.

An aspect of the disclosed embodiments includes a steering torque sensor system that includes at least one magnetic sensor disposed within a torque sensing region to detect a magnetic field within the torque sensing region to determine an angular displacement between an upper steering shaft and a lower steering shaft. The steering torque sensor system also includes at least one stray region sensor located outside of the torque sensing region to detect a stray magnetic field.

Another aspect of the disclosed embodiments includes a system for steering torque sensor stray magnetic field cancellation. The system includes a processor and a memory. The memory includes instructions that, when executed by the processor, cause the processor to: receive, from at least one magnetic sensor disposed within a torque sensing region, a detected magnetic field corresponding to an angular displacement between an upper steering shaft and a lower steering shaft of an electronic power steering system; generate a first torque signal based on the detected magnetic field; receive, from at least one stray region sensor disposed outside of the torque sensing region, a detected stray magnetic field; determine a torque signal error based on the detected stray magnetic field; generate a second torque signal based on the first torque signal and the torque signal error; and selectively control at least a portion of the electronic power steering system using the second torque signal.

Another aspect of the disclosed embodiments includes a method for steering torque sensor stray magnetic field cancellation. The method includes receiving, from at least one magnetic sensor disposed within a torque sensing region, a detected magnetic field corresponding to an angular displacement between an upper steering shaft and a lower steering shaft of an electronic power steering system. The method also includes generating a first torque signal based on the detected magnetic field and receiving, from at least one stray region sensor disposed outside of the torque sensing region, a detected stray magnetic field. The method also includes determining a torque signal error based on the detected stray magnetic field and generating a second torque signal based on the first torque signal and the torque signal error. The method also includes selectively controlling at least a portion of the electronic power steering system assisted by using the second torque signal to reduce he error from the stray magnetic field.

Another aspect of the disclosed embodiments includes an apparatus that includes at least one magnetic sensor that detects a magnetic field within a torque sensing region, the detected magnetic field corresponding an amount of torque applied to a handwheel associated with an electronic power steering system. The apparatus also includes at least one stray region sensor that detects a stray magnetic field outside of the torque sensing region, the stray magnetic field corresponding o the amount o error that may influence the detected torque applied to the handwheel. The apparatus also includes a controller configured to: generate a first torque signal based on the detected magnetic field; determine a torque signal error based on the detected stray magnetic field; generate a second torque signal based on the first torque signal and the torque signal error; and selectively control at least a portion of the electronic power steering system using the second torque signal.

These and other advantages and features will become more apparent from the following description taken in conjunction with the drawings.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 4 generally illustrates an aspect of a method of stray magnetic field cancellation according to the principles of the present disclosure.

DETAILED DESCRIPTION

Figure 1:
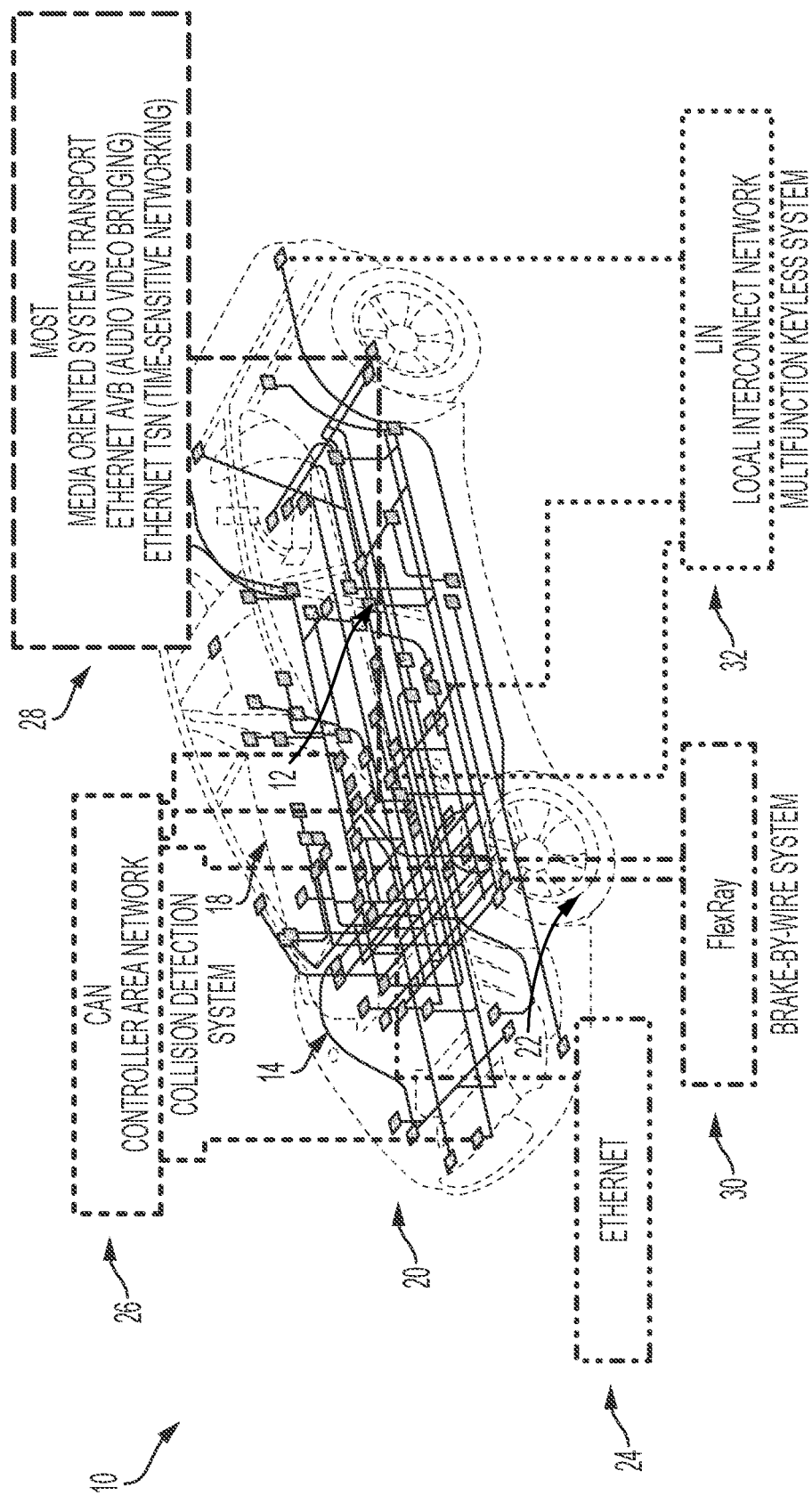
FIG. 1 generally illustrates a vehicle according to the principles of the present disclosure.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a system and method for cancelling torque sensor error caused by stray magnetic fields originating from a composite of single, fixed sources.

As described vehicles, such as cars, trucks, sport utility vehicles, crossovers, mini-vans, or other suitable vehicles, typically include power steering features, such as an electronic power steering (EPS) system. The EPS system is typically configured to provide a steering assist to an operator of a corresponding vehicle. For example, the EPS system may be configured to apply an assist torque to an electric motor, which is connected to a steering mechanism. As the operator interacts with a handwheel or steering wheel associated with the steering mechanism, the amount of force or torque applied by the operator on the handwheel or steering wheel is assisted (e.g., reducing amount of force or torque required by the operator to perform a corresponding steering maneuver) by the electric motor.

In such EPS systems, a measurement of an input torque corresponding to an amount of torque applied by an operator on the handwheel is measured by a torque sensor. Typically, the torque sensor detects an angular displacement between an upper and lower shaft in the EPS system. The shafts are assembled in line with a torsion bar internally affixed between the shafts, such that when torque is applied between the shafts there is a twist angle that is linearly proportional to the torque applied by the operator on the handwheel. This twist angle facilitates a flow of magnetic flux between two rotors assembled to either shaft. The upper shaft rotor typically includes permanent magnets that act as a magnetic source, while the lower shaft rotor typically includes a pair of ferromagnetic ring structures that act as a magnetic flux path. The ferromagnetic ring structures transmit magnetic flux through an air gap region and the flux density produced in a given cross-sectional area of the air gap region is linearly proportional to the displacement angle and the torque applied on the shaft. This flux density can be measured using magnetic sensors (such as Hall effect sensors) to create an electric signal proportional to the applied torque. The magnetic sensors are typically housed upon a printed circuit board (e.g., or circuit card) and plastic housing referred to as a probe housing assembly (PHA).

However, due to the nature of the type of magnetic sensors used to detect the magnetic field, torque measurements (e.g., corresponding to the magnetic field magnitude) may be susceptible to stray magnetic fields that may be incident on the EPS system. With superposition of stray fields upon the desired fields measured within the torque sensor assembly, the stray fields may introduce measurement error on the torque measurements, which may lead to unacceptable system performance.

With increasing electrification of systems in vehicles, especially where high current carrying conductors are being used, there may be sources of stray magnetic field in close proximity to the torque sensor. This may result in measurement error (e.g., when these fields are present). Currently, sensor design does not account for reducing or removing error induced by such stray fields.

Accordingly, systems and methods, such as those described herein, that cancel torque sensor error caused by stray magnetic fields originating from a composite of single, fixed sources, may be desirable. In some embodiments, the systems and methods described herein may be configured to provide a non-contacting torque sensor using a magnetic sensing technique. The systems and methods described herein may be configured to use one or more magnetic sensors within a torque sensing apparatus to measure a flux density proportional to steering torque (e.g., the amount of torque applied by the operator on the handwheel). The systems and methods described herein may be configured to, in addition to the one or more magnetic sensors used within the torque sensing apparatus, use one or more magnetic sensors outside of a sensing region to serve as stray field sensors. In some embodiments, the stray field sensors may be placed at a distance and orientation such that the stray field sensors are not influenced by the magnetic components inherent to the torque sensing apparatus.

In some embodiments, sensors capable of measuring in one or more axes of magnetic field detection may be utilized (e.g., depending on a sensing application). In some embodiments, the systems and methods described herein may be configured to characterize stray magnetic field sources in location corresponding to a steering mechanism of the EPS system and torque sensing apparatus. The systems and methods described herein may be configured to measure output of the stray field sensors and the magnetic sensors (e.g. of the torque sensing apparatus) across an operating range of the stray field sources.

In some embodiments, the systems and methods described herein may be configured to determine a baseline performance of the EPS system (e.g., and the torque sensing apparatus). The systems and methods described herein may be configured to measure the magnetic fields at a static, neutral handwheel position, without torque applied to the handwheel and without any response from the EPS system that may result in a physical movement of the EPS system (e.g., with no stray magnetic fields present).

In some embodiments, the systems and methods described herein may be configured to measure the magnetic fields at varying levels of incident stray magnetic fields present in the EPS system. The systems and methods described herein may be configured to measure and record the magnetic fields and the stray magnetic fields at the varying levels.

In some embodiments, the systems and methods described herein may be configured to establish a mathematical relationship between the signal measured by the stray field sensor and the amount of error induced on the torque sensor (e.g., the magnetic sensors used to measure the magnetic fields corresponding to the torque applied on the handwheel). The systems and methods described herein may be configured to calculate a mathematical cancellation factor using the mathematical relationship. The systems and methods described herein may be configured to adjust a torque signal corresponding to the detected magnetic fields (e.g., for a given detected magnetic field) by subtracting a corresponding cancellation factor. The systems and methods described herein may be configured to dynamically remove the error that is imparted on the torque sensor from the stray magnetic fields by generating an estimate of the torque error using a stray field measurement and removing this estimated torque error from the torque signal.

In some embodiments, the system and methods described herein may be configured to generate a torque error model based on the relationship between the detected magnetic fields and the detected stray magnetic fields for varying levels of operation of the stray field sources. The systems and methods described herein may store the torque error model in an associated memory. The systems and methods described herein may be configured to access the torque error model to determine an estimated error associated with the detected stray fields. The systems and methods described herein may be configured to adjust the torque signal based on the estimated error.

In some embodiments, the stray field sensors may include stray field probes. The stray field probes may provide a digital or analog output. In some embodiments, the stray probes may include digital outputs having a dedicated input and/or output (I/O) interface to a controller of the EPS system. In some embodiments, the digital outputs may share existing torque signal lines and I/O, which may reduce a number of wires used in the systems described herein. In some embodiments, the stray field probes may share a common power supply with the torque sensing apparatus (e.g., including the magnetic field sensors). In some embodiments, the stray field probes may receive power from an isolated power supply. In some embodiments, the systems and methods described herein may be configured to derive any suitable mechanizations of a torque sensor using stray field cancellation.

In some embodiments, the systems and methods described herein may be configured to receive, from at least one magnetic sensor disposed within a torque sensing region, a detected magnetic field corresponding to an angular displacement between an upper steering shaft and a lower steering shaft of an electronic power steering system. The systems and methods described herein may be configured to generate a first torque signal based on the detected magnetic field. The systems and methods described herein may be configured to receive, from at least one stray region sensor disposed outside of the torque sensing region, a detected stray magnetic field.

The systems and methods described herein may be configured to determine a torque signal error based on the detected stray magnetic field. The systems and methods described herein may be configured to generate a second torque signal based on the first torque signal and the torque signal error estimate. The systems and methods described herein may be configured to selectively control at least a portion of the electronic power steering system using the second torque signal. In some embodiments, the systems and methods described herein may be configured to estimate the torque signal error using a torque error model configured to estimate the torque signal error using the detected stray magnetic field.

In some embodiments, the at least one stray region sensor includes a probe. In some embodiments, the probe provides digital output. In some embodiments, the probe provides analog output. In some embodiments, the at least one magnetic sensor and the at least one stray region sensor are disposed on a printed circuit board. In some embodiments, the at least one stray region sensor shares a common power supply with the at least one magnetic sensor. In some embodiments, the at least one stray region sensor receives power from an isolated power supply that is different from a power supply that provides power to the at least one magnetic sensor. In some embodiments, the first torque signal represents an amount of torque applied to a handwheel associated with the electronic power steering system. In some embodiments, the detected magnetic field is influenced by the detected stray magnetic field.

FIG. 1 generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles.

The vehicle 10 includes a vehicle body 12 and a hood 14. A passenger compartment 18 is at least partially defined by the vehicle body 12. Another portion of the vehicle body 12 defines an engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position. In some embodiments, the engine compartment 20 may be disposed on rearward portion of the vehicle 10 than is generally illustrated.

The passenger compartment 18 may be disposed rearward of the engine compartment 20, but may be disposed forward of the engine compartment 20 in embodiments where the engine compartment 20 is disposed on the rearward portion of the vehicle 10. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system.

In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system. As such, in some embodiments, the vehicle 10 may be an autonomous vehicle.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22. When the vehicle 10 includes one or more electric motors, a vehicle battery, and/or fuel cell provides energy to the electric motors to turn the wheels 22.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

In some embodiments, the vehicle 10 may include an Ethernet component 24, a controller area network (CAN) bus 26, a media oriented systems transport component (MOST) 28, a FlexRay component 30 (e.g., brake-by-wire system, and the like), and a local interconnect network component (LIN) 32. The vehicle 10 may use the CAN bus 26, the MOST 28, the FlexRay Component 30, the LIN 32, other suitable networks or communication systems, or a combination thereof to communicate various information from, for example, sensors within or external to the vehicle, to, for example, various processors or controllers within or external to the vehicle. The vehicle 10 may include additional or fewer features than those generally illustrated and/or disclosed herein.

The vehicle 10 may include an electronic power steering (EPS) system. The EPS system may include an EPS controller area network (CAN) bus. The EPS CAN bus may be in communication with a vehicle CAN bus of the vehicle 10. The vehicle CAN bus may include features similar to those of the CAN bus 26 or other suitable features. The vehicle CAN bus may communicate with various sensors within the vehicle 10 and receive various measurements from the various sensors. For example, the one or more sensors of the vehicle 10 may measure vehicle speed of the vehicle 10, vehicle yaw rate of the vehicle 10, handwheel or steering wheel angle of the vehicle 10, road wheel angle of the vehicle 10, other suitable measurements, or a combination thereof. The vehicle CAN bus may receive, from a controller of the vehicle 10, one or more signals indicating the various measurements. For example the vehicle CAN bus may receive a vehicle speed signal indicating a measured vehicle speed of the vehicle 10. The vehicle CAN bus may communicate the one or more signals to the EPS CAN bus. The EPS CAN bus may communicate the one or more signals to the EPS controller.

Figure 6:
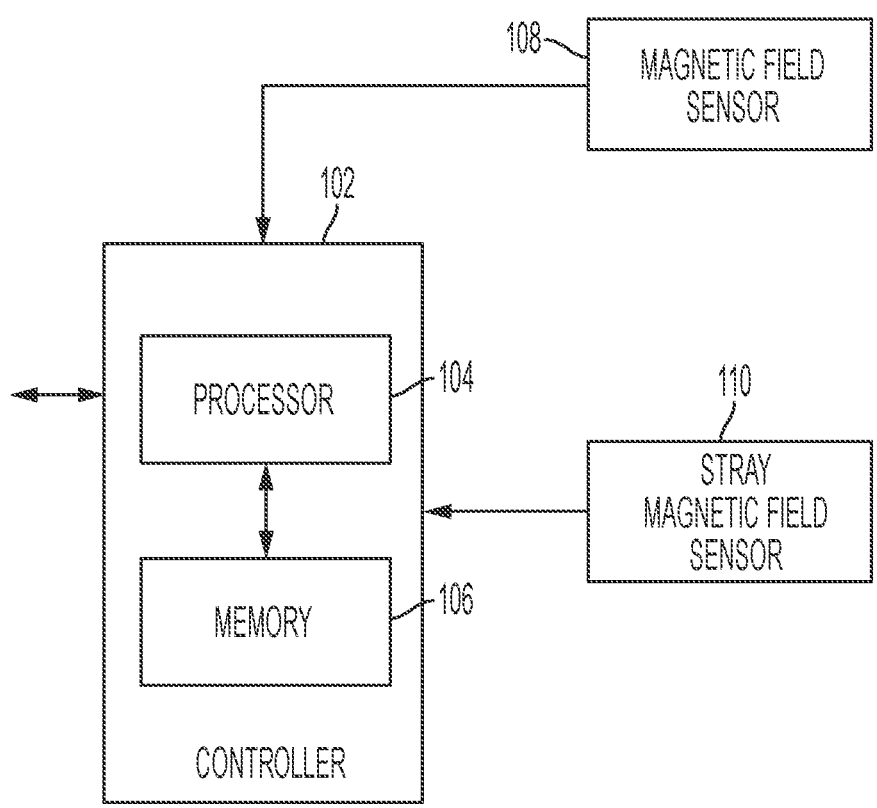
FIG. 6 generally illustrates a block diagram of a stray magnetic field cancellation system according to the principles of the present disclosure.

The EPS system may be configured to assist and/or control steering of the vehicle 10. The EPS system may include or be in communication with various sensors configured to measure various aspects of the steering system of the vehicle 10. The EPS system may include one or more controller, such as an EPS microcontroller unit (MCU), herein after referred to as the controller 102, as is generally illustrated in FIG. 6. The controller 102 may include a processor 104 and associated memory 106. The processor 104 may include any suitable processor, such as those described herein. The memory 106 may comprise a single disk or a plurality of disks (e.g., hard drives), and includes a storage management module that manages one or more partitions within the memory 106. In some embodiments, memory 106 may include flash memory, semiconductor (solid state) memory or the like. The memory 106 may include Random Access Memory (RAM), a Read-Only Memory (ROM), or a combination thereof. The memory 106 may include instructions that, when executed by the processor 104, cause the processor 104 to, at least, detect input torque corresponding to torque applied by the operator on the handwheel of the vehicle 10. The controller 102 may include any suitable number of processors and/or memory in addition to those described herein. It should be understood that the EPS system may include any suitable number of controllers, processors, and memory.

The controller 102 may determine various values corresponding to the one or more signals. For example, the controller 102 may receive a vehicle speed signal (e.g., a first vehicle speed signal) and may determine a vehicle speed value (e.g., a first vehicle speed) based on the vehicle speed signal. The controller 102 may determine one or more assist torque values based on the various values determined from the one or more signals. The one or more assist torque values may correspond to an amount of torque to be provided to an EPS motor. The controller 102 may selectively control the EPS motor using the one or more assist torque values. The EPS motor may be in communication with the steering system, such as a steer-by-wire system or other suitable steering system of the vehicle 10. The EPS motor, when controlled according to the one or more assist torque values, provides a steering assist to steering components of the steering system of the vehicle 10. The steering assist may reduce an amount of torque or force required by the operator of the vehicle 10 to execute a corresponding steering maneuver.

Figure 2:
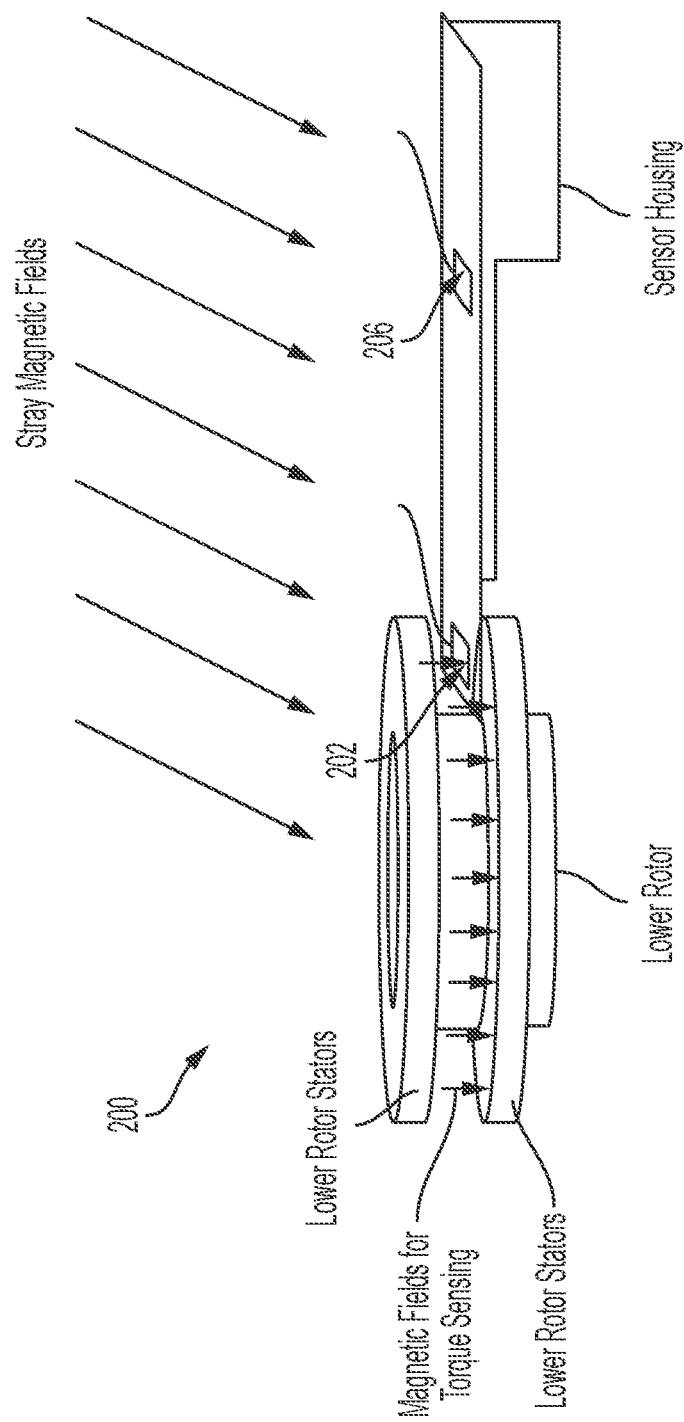
FIG. 2 generally illustrates a perspective view of a steering torque sensor subjected to a stray magnetic field according to the principles of the present disclosure.
Figure 3:
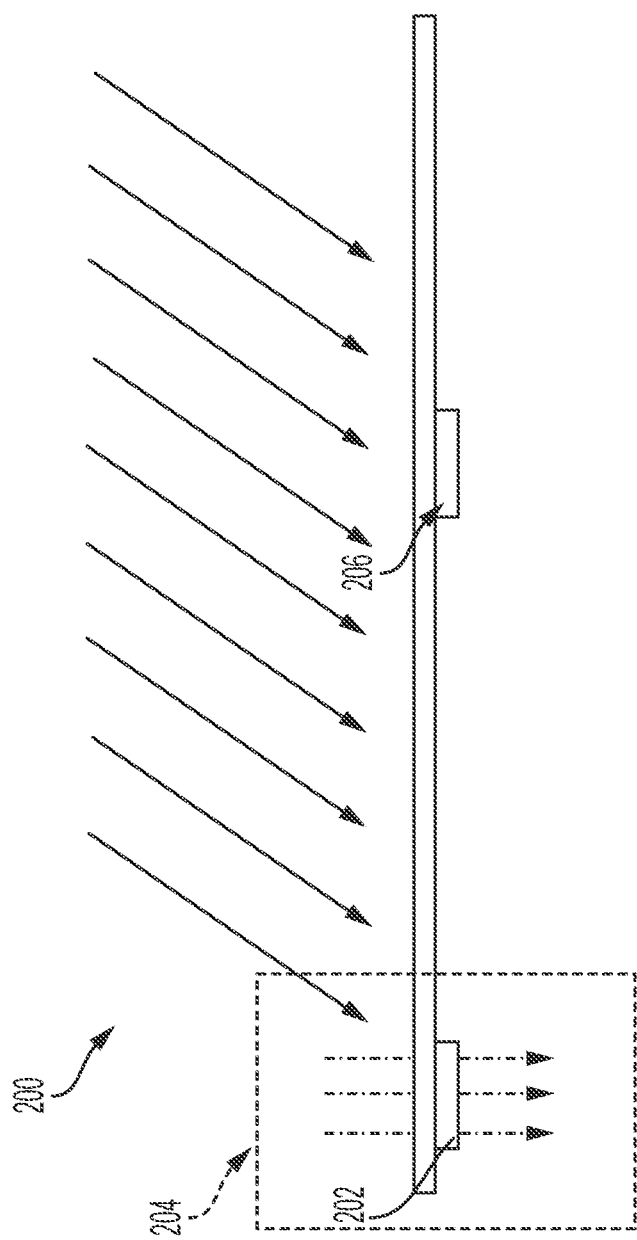
FIG. 3 generally illustrates a sectional view of the steering torque sensor subjected to a stray magnetic field according to the principles of the present disclosure.
Figure 5:
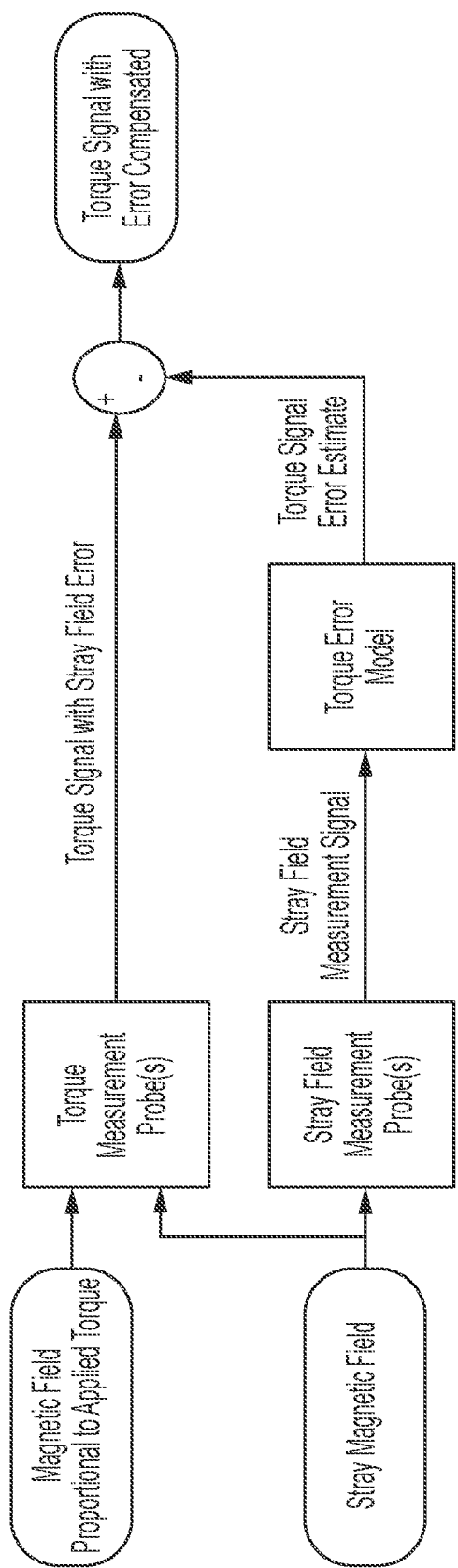
FIG. 5 generally illustrates another aspect of the method of stray magnetic field cancellation.

In some embodiments, controller 102 may communicate with a torque sensing apparatus 200, as is generally illustrated in FIG. 2. The apparatus 200 may include one or more magnetic sensors 202 (e.g., which may be referred to as a torque sensor) disposed in a torque sensing region 204 of the apparatus 200, as is generally illustrated in FIG. 3. The sensor 202 may include any suitable sensor, probe, or other suitable mechanism configured to detect magnetic fields in the torque sensing region 204.

The apparatus 200 may include one or more stray magnetic field sensors 206 configured to detect stray magnetic fields influencing the magnetic field detected by the sensor 202. The sensor 206 may include any suitable sensor, probe, or other suitable mechanism configured to detect stray magnetic fields in proximity to the apparatus 200. The sensor 206 may be disposed on the apparatus 200 outside of the torque sensing region 204, such that the sensor 206 is not influenced by the magnetic field within the torque sensing region 204.

In some embodiments, the sensor 202 and/or the sensor 204 may operate in one or more axes of magnetic field detection.

The controller 102 may receive, from the sensor 202, a detected magnetic field (e.g., or a value representing the detected magnetic field) within the torque sensing region 204. The detected magnetic field may correspond to an angular displacement between an upper steering shaft and a lower steering shaft of the EPS system. The controller 102 may generate a first torque signal based on the detected magnetic field. The first torque signal may represent the amount of torque applied by the operator to the handwheel of the vehicle 10. The first torque signal (e.g., and the detected magnetic field) may be influenced by one or more stray magnetic fields in close proximity to the torque sensing apparatus 200. It should be understood that the controller 102 may receive a plurality of detected magnetic fields from the sensor 206 and may generate corresponding torque signals.

The controller 102 may receive, from the sensor 206, a detected stray magnetic field (e.g., or a value representing the detected stray magnetic field). The controller 102 may determine a torque signal error based on the detected stray magnetic field. For example, the controller 102 may access the torque error model and identify an estimated error corresponding to the detected stray magnetic field (e.g., an amount of influence that the detected stray magnetic field has on the magnetic field within the torque sensing region 204).

The controller 102 may determine the torque signal error based on the estimated error. The controller 102 may generate a second torque signal based on the first torque signal and the torque signal error. The controller 102 may then provide the second torque signal to the EPS system, such as to the EPS motor or other suitable component. The EPS system may use the second torque signal as the input torque signal, as described.

In some embodiments, the controller 102 may perform the methods described herein. However, the methods described herein as performed by the controller 102 are not meant to be limiting, and any type of software executed on a controller can perform the methods described herein without departing from the scope of this disclosure. For example, a controller, such as a processor executing software within a computing device, can perform the methods described herein.

Figure 7:
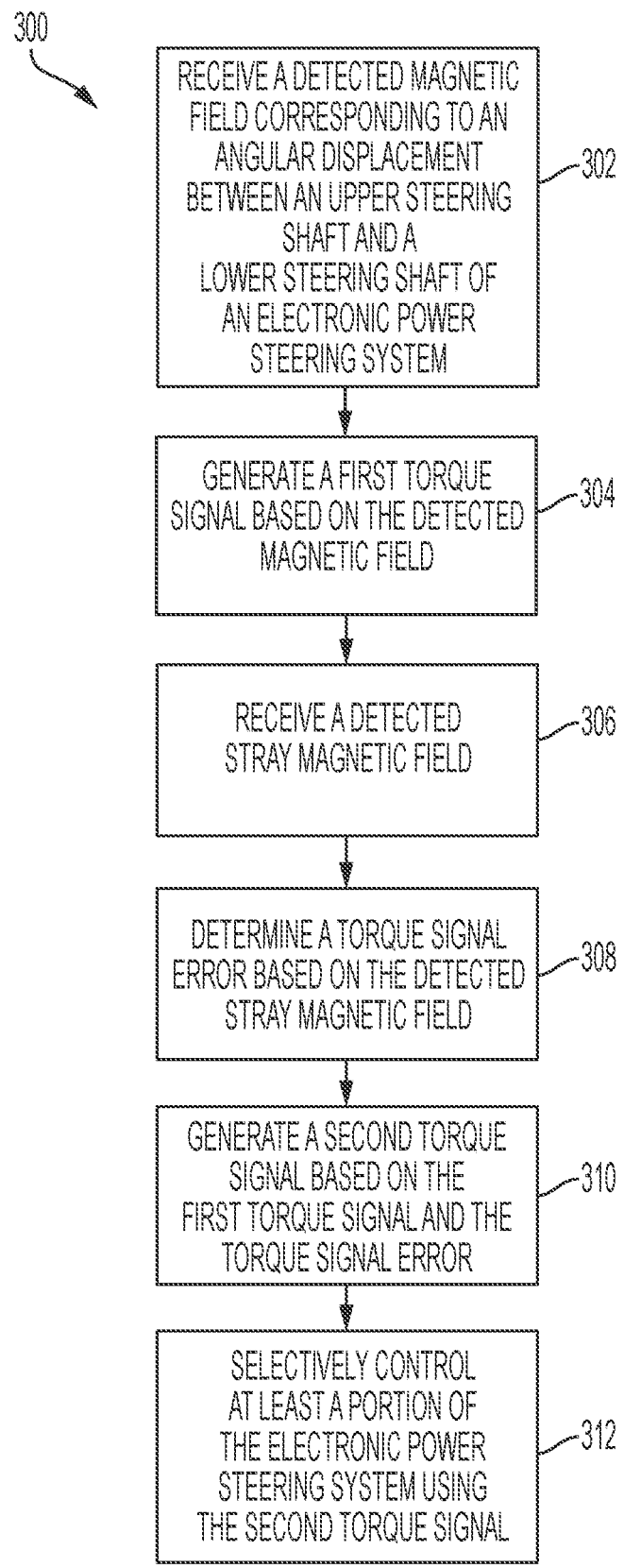
FIG. 7 is a flow diagram generally illustrating a stray magnetic field cancellation method according to the principles of the present disclosure.

FIG. 7 is a flow diagram generally illustrating a stray magnetic field cancellation method 300 according to the principles of the present disclosure. At 302, the method 300 receive a detected magnetic field corresponding to an angular deployment between an upper steering shaft and a lower steering shaft of an electronic power steering system. For example, the controller 102 receives the detected magnetic field from the sensor 202.

At 304, the method 300 generates a first torque signal based on the detected magnetic field. For example, the controller 102 generates the first torque signal.

At 306, the method 300 receives a detected stray magnetic field. For example, the controller 102 receives the detected stray magnetic field from the sensor 206.

At 308, the method 300 determines a torque signal error based on the detected stray magnetic field. For example, the controller 102 determines the torque signal error using the torque error model.

At 310, the method 300 generates a second torque signal based on the first torque signal and the torque signal error. For example, the controller 102 generates the second torque signal based on the first torque signal and the torque signal error.

At 312, the method 300 selectively controls at least a portion of the electronic power steering system using the second torque signal. For example, the controller 102 selectively controls at least a portion of the EPS system using the second torque signal.

In some embodiments, a system for steering torque sensor stray magnetic field cancellation includes a processor and a memory. The memory includes instructions that, when executed by the processor, cause the processor to: receive, from at least one magnetic sensor disposed within a torque sensing region, a detected magnetic field corresponding to an angular displacement between an upper steering shaft and a lower steering shaft of an electronic power steering system; generate a first torque signal based on the detected magnetic field; receive, from at least one stray region sensor disposed outside of the torque sensing region, a detected stray magnetic field; determine a torque signal error based on the detected stray magnetic field; generate a second torque signal based on the first torque signal and the torque signal error; and selectively control at least a portion of the electronic power steering system using the second torque signal.

In some embodiments, the at least one stray region sensor includes a probe. In some embodiments, the probe provides digital output. In some embodiments, the probe provides analog output. In some embodiments, the at least one magnetic sensor and the at least one stray region sensor are disposed on a printed circuit board. In some embodiments, the at least one stray region sensor shares a common power supply with the at least one magnetic sensor. In some embodiments, the at least one stray region sensor receives power from an isolated power supply that is different from a power supply that provides power to the at least one magnetic sensor. In some embodiments, the first torque signal represents an amount of torque applied to a handwheel associated with the electronic power steering system. In some embodiments, the detected magnetic field is influenced by the detected stray magnetic field. In some embodiments, the instructions further cause the processor to determine the torque signal error using a torque error model configured to estimate the torque signal error using the detected stray magnetic field.

In some embodiments, a method for steering torque sensor stray magnetic field cancellation includes receiving, from at least one magnetic sensor disposed within a torque sensing region, a detected magnetic field corresponding to an angular displacement between an upper steering shaft and a lower steering shaft of an electronic power steering system. The method also includes generating a first torque signal based on the detected magnetic field and receiving, from at least one stray region sensor disposed outside of the torque sensing region, a detected stray magnetic field. The method also includes determining a torque signal error based on the detected stray magnetic field and generating a second torque signal based on the first torque signal and the torque signal error. The method also includes selectively controlling at least a portion of the electronic power steering system using the second torque signal.

In some embodiments, the at least one stray region sensor includes a probe. In some embodiments, the probe provides digital output. In some embodiments, the probe provides analog output. In some embodiments, the at least one magnetic sensor and the at least one stray region sensor are disposed on a printed circuit board. In some embodiments, the first torque signal represents an amount of torque applied to a handwheel associated with the electronic power steering system. In some embodiments, the detected magnetic field is influenced by the detected stray magnetic field. In some embodiments, the method also includes determining the torque signal error using a torque error model configured to estimate the torque signal error using the detected stray magnetic field.

In some embodiments, an apparatus includes at least one magnetic sensor that detects a magnetic field within a torque sensing region, the detected magnetic field corresponding an amount of torque applied to a handwheel associated with an electronic power steering system. The apparatus also includes at least one stray region sensor that detects a stray magnetic field outside of the torque sensing region, the detected magnetic field being influenced by the detected stray magnetic field. The apparatus also includes a controller configured to: generate a first torque signal based on the detected magnetic field; determine a torque signal error based on the detected stray magnetic field; generate a second torque signal based on the first torque signal and the torque signal error; and selectively control at least a portion of the electronic power steering system using the second torque signal.

In some embodiments, the controller is further configured to determine the torque signal error using a torque error model configured to estimate the torque signal error using the detected stray magnetic field.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

Having thus described the present disclosure, it is claimed:

1. A system for steering torque sensor stray magnetic field cancellation, the system comprising:
   a processor; and
   a memory including instructions that, when executed by the processor, cause the processor to:
   receive, from at least one magnetic sensor disposed within a torque sensing region, a detected magnetic field corresponding to an angular displacement between an upper steering shaft and a lower steering shaft of an electronic power steering system;
   generate a first torque signal based on the detected magnetic field;
   receive, from at least one stray region sensor disposed outside of the torque sensing region, a detected stray magnetic field;
   determine a torque signal error based on the detected stray magnetic field;
   generate a second torque signal based on the first torque signal and the torque signal error; and
   selectively control at least a portion of the electronic power steering system using the second torque signal.

2. The system of claim 1, wherein the at least one stray region sensor includes a probe.

3. The system of claim 2, wherein the probe provides digital output.

4. The system of claim 2, wherein the probe provides analog output.

5. The system of claim 1, wherein the at least one magnetic sensor and the at least one stray region sensor are disposed on a printed circuit board.

6. The system of claim 1, wherein the at least one stray region sensor shares a common power supply with the at least one magnetic sensor.

7. The system of claim 1, wherein the at least one stray region sensor receives power from an isolated power supply that is different from a power supply that provides power to the at least one magnetic sensor.

8. The system of claim 1, wherein the first torque signal represents an amount of torque applied to a handwheel associated with the electronic power steering system.

9. The system of claim 1, wherein the detected magnetic field is influenced by the detected stray magnetic field.

10. The system of claim 1, wherein the instructions further cause the processor to determine the torque signal error using a torque error model configured to estimate the torque signal error using the detected stray magnetic field.

11. A method for steering torque sensor stray magnetic field cancellation, the method comprising:
    receiving, from at least one magnetic sensor disposed within a torque sensing region, a detected magnetic field corresponding to an angular displacement between an upper steering shaft and a lower steering shaft of an electronic power steering system;
    generating a first torque signal based on the detected magnetic field;
    receiving, from at least one stray region sensor disposed outside of the torque sensing region, a detected stray magnetic field;
    determining a torque signal error based on the detected stray magnetic field;
    generating a second torque signal based on the first torque signal and the torque signal error; and
    selectively controlling at least a portion of the electronic power steering system using the second torque signal.

12. The method of claim 11, wherein the at least one stray region sensor includes a probe.

13. The method of claim 12, wherein the probe provides digital output.

14. The method of claim 12, wherein the probe provides analog output.

15. The method of claim 11, wherein the at least one magnetic sensor and the at least one stray region sensor are disposed on a printed circuit board.

16. The method of claim 11, wherein the first torque signal represents an amount of torque applied to a handwheel associated with the electronic power steering system.

17. The method of claim 11, wherein the detected magnetic field is influenced by the detected stray magnetic field.

18. The method of claim 11, further comprising determining the torque signal error using a torque error model configured to estimate the torque signal error using the detected stray magnetic field.

19. An apparatus comprising:
    at least one magnetic sensor that detects a magnetic field within a torque sensing region, the detected magnetic field corresponding an amount of torque applied to a handwheel associated with an electronic power steering system;
    at least one stray region sensor that detects a stray magnetic field outside of the torque sensing region, the detected magnetic field being influenced by the detected stray magnetic field; and
    a controller configured to:
        generate a first torque signal based on the detected magnetic field;
        determine a torque signal error based on the detected stray magnetic field;
        generate a second torque signal based on the first torque signal and the torque signal error; and
        selectively control at least a portion of the electronic power steering system using the second torque signal.

20. The apparatus of claim 19, wherein the controller is further configured to determine the torque signal error using a torque error model configured to estimate the torque signal error using the detected stray magnetic field.

* * * * *